United States Patent [19]

Johnson

[11] Patent Number: 4,520,925
[45] Date of Patent: Jun. 4, 1985

[54] PACKAGE

[75] Inventor: Douglas M. Johnson, Chanhassen, Minn.

[73] Assignee: Empak Inc., Chanhassen, Minn.

[21] Appl. No.: 521,723

[22] Filed: Aug. 9, 1983

[51] Int. Cl.³ .............................................. B65D 85/48
[52] U.S. Cl. .................................... 206/334; 206/587; 206/454; 206/586; 220/324
[58] Field of Search ............... 206/445, 454, 334, 458, 206/586, 456, 587, 593; 220/324, 326

[56] References Cited

U.S. PATENT DOCUMENTS

| | | | |
|---|---|---|---|
| 3,923,156 | 12/1975 | Wallestad | 206/445 |
| 3,934,733 | 1/1976 | Worden | 206/445 |
| 4,043,451 | 8/1977 | Johnson | 206/454 |
| 4,061,228 | 12/1977 | Johnson | 206/454 |
| 4,160,504 | 7/1979 | Kudlich et al. | 206/454 |
| 4,171,740 | 10/1979 | Clement et al. | 206/445 |
| 4,248,346 | 2/1981 | Johnson | 206/454 |

FOREIGN PATENT DOCUMENTS 890217 2/1944 France .............................. 206/454

*Primary Examiner*—Joseph Man-Fu Moy
*Attorney, Agent, or Firm*—Hugh D. Jaeger

[57] ABSTRACT

Container package for transporting a plurality of silicon wafers for shipment as well as preventing contamination thereof. The wafer container package includes a wafer cassette having two sides, a configured end, and an H bar end including an upper and lower ramp support with the bar being reinforced by a partially cylindrical rod; a package bottom including four sides, an edge surrounding the sides, hook latches, four internal side dividing members and a flat bottom; and a package top including four sides, a lip to encompass the edge, configured independent opposing flexible grooved members, and recessed top surface for stacking where the cassette is positioned by internal side dividers in the package tops and bottoms for secure placement. The three components provide that the cassette mates between the package tops and bottoms, the wafers mate in the cassette and with the top opposing members, the package tops and bottoms mate between the trough, and the hook ends secure the package tops and bottoms together and also secure the cassette and wafers therein. The sides of the package are smooth, providing for a flush perimeter for taping. The recessed top surface provides for stacking of like packages. The smooth, rounded contour design of the package provides a package design for shrink wrapping. The package limits and prohibits wafer movement and eliminates wafer breakage.

15 Claims, 9 Drawing Figures

PACKAGE

BACKGROUND OF THE INVENTION

1. Field of the Invention

The present invention relates to a package and container and, more particularly, pertains to a contourized silicon wafer container package for transporting and storage of silicon wafers by a three-components, cassette, package top and package bottom.

2. Description of the Prior Art

The prior art packages for shipment and storage of silicon wafers have exhibited certain deficiencies throughout the course of utilization of silicon wafers for the processing into integrated circuits.

One of the deficiencies of the prior art was a secure cassette for not only holding and transporting the wafers, but for subsequent placement in wafer processing machinery and wafer transfer for processing such as through airtrack suction, or rubber belt processes. The prior art carriers and transport boxes required a double time motion in first packing the transport carrier with wafers and then second transferring the wafers from a transport carrier to a processing carrier. This caused damage to the silicon wafers as well as lost time and motion and with breaking of the wafers during transportation and transfer therein.

Another deficiency of the prior art was a storage box which secured the wafer in a closed environment and could withstand the rigors of the transportation industry, whether by motor freight or by air freight. The prior art containers did not exist to provide for an uncontaminated environment, the packages were not smooth, and the prior art carriers were not provided for usually interlocking and interengaging with other portions of the package. Consequently, packages were cause for contamination and breakage of the wafers during shipment or storage.

The present invention overcomes the disadvantages of the prior art by providing a package providing for shipment of silicon wafers including components of a wafer cassette, a package top and a package bottom which interlocks and interengages with respect to each other with a plurality of wafers in the cassette, providing for a safe, uncontaminated and flush perimeter package for taping in addition to securing of the wafers in the cassette with the wafers in the cassette secured between the package bottoms and the package tops. The new cassette designs provides full depth packing of the wafers and point contact of the wafers for better stability and minimum wafer contact respectively.

SUMMARY OF THE INVENTION

The general purpose of the present invention is to provide a contourized wafer container package for silicon wafers during transportation and storage where the package includes a number of projections for engaging and encompassing the silicon wafer through the interaction of the three components of the cassette, package top and package bottom.

According to one embodiment of the present invention, there is provided an integrated circuit wafer container package including in combination, a wafer cassette including opposing mirror-image sides, a substantially closed end with a curved upper portion, and an open H-bar end configured and including a ramped top and bottom portion, a partial cylindrical member secured across the H-bar end, and two vertical sides at either end of the bar; a package bottom including a bottom, four slightly angled sides, and edge groove surrounding the sides, hook catches including a finger hole, internal vertical side and end positioning members; and, a package top including a top member, four sides surrounding the top, a tongue lip for encompassing the edge, opposing flexible grooved members for independently mating the circumference of each wafer, side positioning members extending outwardly from the interior of the sides and ends, hole indentation members positioned on outer hook latches for hooking to catches on the package bottom, hole indentations in the center of each member corresponding to a finger hole, and a recessed top surface on the package top whereby wafers are engaged between the dividers of the cassette, and also between the cassette and the fingers of the package top, the cassette engages and interlocks between the vertical side and end members between the package top and package bottom, the package top tongue engages into the package bottom groove, and the latches engage over the catches between the bottom and top packages respectively, and the top recessed surface provides for stacking of like packages in storage thereby assuring a secure and contamination-free environment for transportation and storage of wafers and a rounded, contoured package for heat-shrink wrapping.

One significant aspect and feature of the present invention is a package for transporting and storage of integrated circuit silicon wafers. The package provides a perimeter-free edge for taping as a seal, the like as well as interlocking between the bottom and top of the package. The package also provides for interlocking and engagement of the cassette so as to prevent damage or possible movement of the wafers and cassette during transportation.

Another significant aspect and feature of the present invention is a silicon wafer cassette which can be placed into automatic processing machinery for wafer removal processing either by air suction, airtrack, rubberband endless loop process; and provides for a secure and safe cassette through a reinforced H-bar end construction. The H-bar construction includes a ramped top, a round bottom, a reinforced H-bar with a partial cylinder section and two vertical outwardly extending side members.

Other significant aspects and features of the present invention is a recessed top surface for stacking and providing for interlocking stacking of the boxes.

An additional significant aspect and feature of the present invention is a package which is also designed without sharp edges but a rounded contour on the exterior so that a polyethylene, mylar or similar film may be shrink-wrapped around it to prevent contamination and/or infiltration of dirt or air.

A further significant aspect and feature of the present invention is an affirmative embodiment of a package top including a plurality of opposing independent finger members which are independently flexible of each other, which provides for independent movement on engaging of a wafer and which expand outwardly, positioning the wafer within the cassette and providing for positioning of the wafers within the cassette bottom. The members have an angle when engaged against the cassette and also provide an upward pressure for popping open the top when the hook latches are moved away from the latch, thereby in effect automatically opening the package top from the package bottom. The members provide a twofold purpose in not only securing the wafers but in also assisting in opening the package top.

Having thus described embodiments of the present invention, it is a principal object hereof to provide a contourized silicon wafer container package designed to deliver clean, uncontaminated silicon wafers for the integrated circuit industry.

One object of the present invention is to provide wafers in a cassette and package providing stability as well as non-contaminability and structural integrity of each wafer in the cassette.

Another object of the present invention is to provide a package which maintains low level of particulate contamination providing for the highest quality silicon wafers.

A further object of the present invention is to provide a cassette which is reusable as well as having H-bar end construction providing compatibility with wafer processing equipment. During the course of processing of the wafer, the cassette can be utilized until the wafer becomes a plurality of micro-electronic chips. The cassette is suitable for end use by the processor in many applications.

An additional object of the present invention is to provide a silicon wafer package with opposing members which space the wafers with respect to each other, secure the wafers within the cassette, and also provide upward force due to the spring action of each member popping off the top when the hook latches are removed thereby providing for smooth and easy action of removing the package top from the package bottom.

A further object of the present invention is a cassette which provides full depth protection of the wafer and point contact of the wafer for better stability and only point to point contact between the wafer and the cassette.

BRIEF DESCRIPTION OF THE DRAWINGS

Other objects and many of the attendant advantages of this invention will be readily appreciated as the same becomes better understood by reference to the following detailed description when considered in connection with the accompanying drawings, in which like reference numerals designate like parts throughout the figures thereof and wherein.

DESCRIPTION OF PREFERRED EMBODIMENTS

Figure 1:
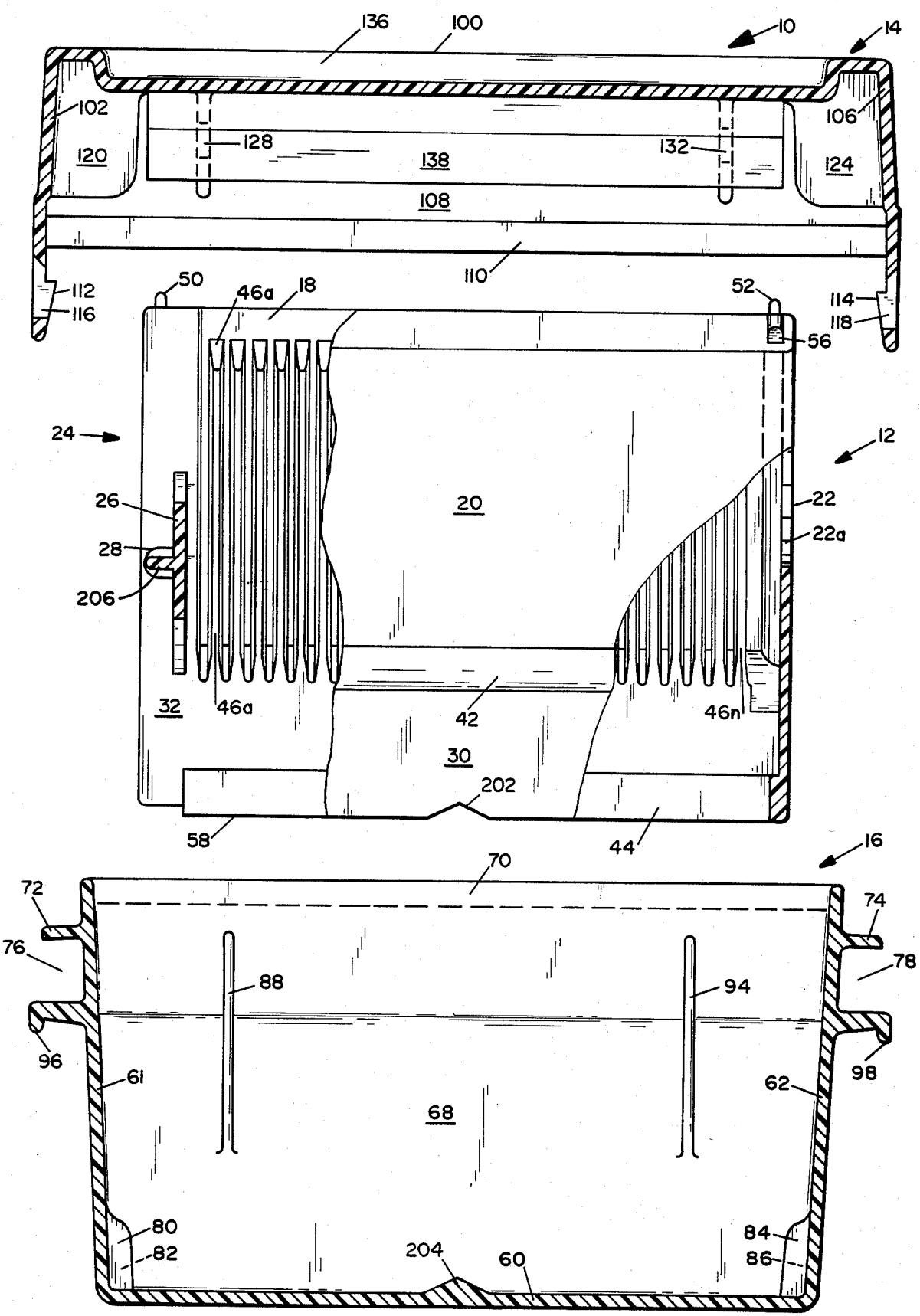
FIG. 1 illustrates a cross-sectional side view of a wafer container package including three separated components from top to bottom in order of a package top, a wafer cassette, and a package bottom.

FIG. 1, which illustrates a cross-sectional side view of a wafer package 10, shows the three components of a cassette 12, a package top 14, and a package bottom 16 separated and in alignment with respect to each other. For purposes of reference, FIG. 5 illustrates the three components 12, 14 and 16 assembled in a cross-sectional view. Reference is now made to FIGS. 1-5 in the following discussion, with reference particularly to FIG. 1.

The cassette 12 includes geometrically configured opposing right and left mirror-image sides 18 and 20, a flat planar end 22 with a downward rounded top edge 22a, and an open H-bar end 24. The H-bar end 24 includes a configured flat H member 26, a rounded horizontal partial rod cylindrical support 28, a right vertical edge support 30 and a left vertical edge support 32, opposing ramped top portions 34 and opposing ramped bottom portions 36. Downwardly extending ramped left and right point wafer supports 40 and 42 supports sides 18 and 20 to surrounding reinforced edge 58 having three sided member 44 therebetween as later described. A plurality of vertically opposing outwardly extending dividers 46a–46n and 48a–48n partition the cassette 12 for encompassing a plurality of wafers such as silicon integrated circuit wafers or the like. Locating pins 50 and 52 and holes 54 and 56 are provided on the top of the cassette for processing machinery. A reinforced bottom edge 58 is provided about the lower edge 44 for structural stability. The dividers take the shape of rounded teeth with areas therebetween upon which the wafers have perimeter contact.

Figure 4:
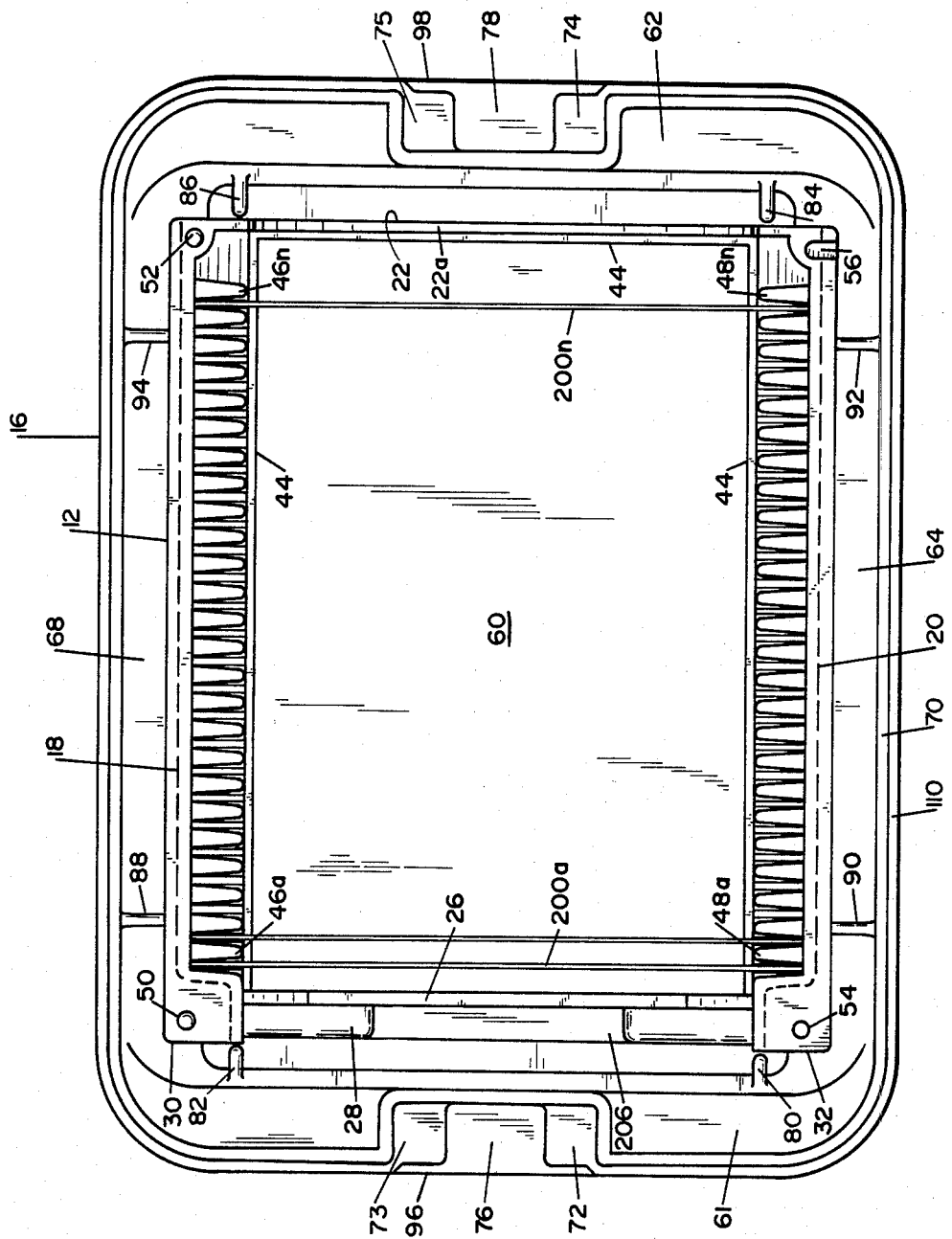
FIG. 4 illustrates a top view showing the mating of the cassette into the package bottom.
Figure 5:
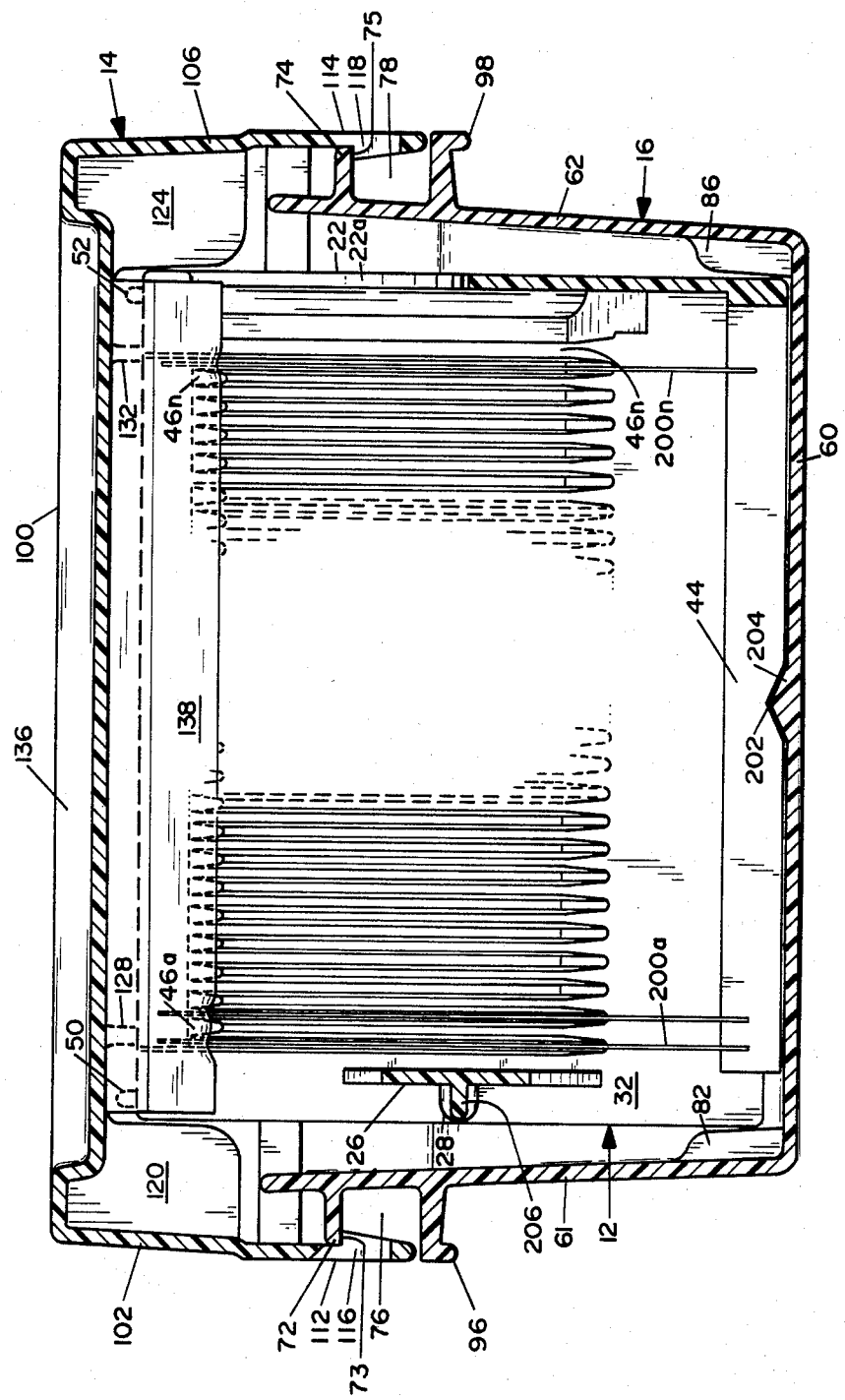
FIG. 5 illustrates a cross-sectional view of an interlocked and engaged cassette, package bottom and package top.

The package bottom 16 includes a substantially flat bottom 60, four rectangular sides 61, 62, 64 and 68, an offset configured groove edge 70, opposing hook catches 72 and 74 with finger holes 76 and 78, four end guides 80, 82, 84 and 86, and four side guides 88, 90, 92 and 94 of FIG. 4. The end guides 80-86 are curved for engagement and alignment with the cassette 12. Lower members 96 and 98 position below the catches 72 and 74 respectively for providing a flush surface and protection against accidental opening of the latches as later discussed.

Package top 14 includes a substantially horizontal top 100, substantially angulared sides 102, 104, 106 and 108, and tongue lip 110 including a geometrical shape to insert, engage, and enter about the female offset edge groove 70 of the package 16. The package top also includes latches 112 and 114, finger access holes 116 and 118, vertical and angled members 120, 122, 124 and 126, and configured side angled vertical members 128, 130, 132 and 134 for aligning with cassette 14. Recess 136 is provided in the top 100 for stacking. Opposing longitudinal finger members 136 and 138 protrude from top 100 downwardly for engaging with the wafer edges at spaced opposed arcuate positions and are separately independent of each other as later illustrated in FIGS. 6 and 7. In the alternative, the top can utilize separate opposing fingers or staggered opposing fingers.

Figure 2:
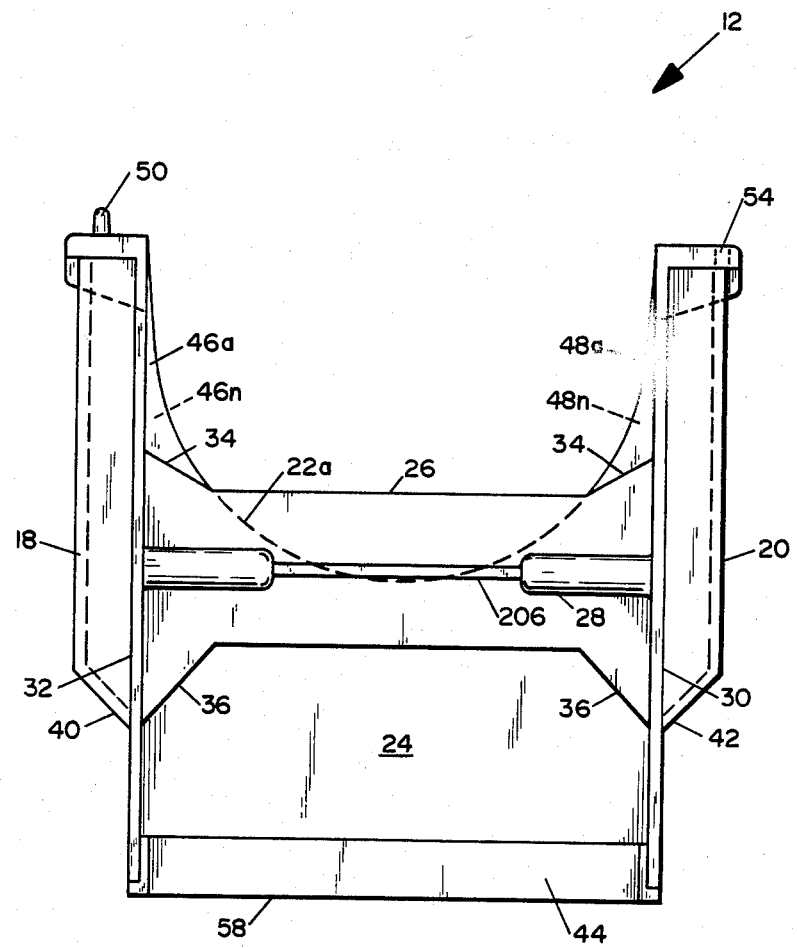
FIG. 2 illustrates an end view of the open end of the H-bar end construction of the cassette.

FIG. 2 illustrates an end view of the cassette 12, the middle element of FIG. 1 showing the H-bar 26 and partial cylindrical rod member 28 thereon for stability. All other numerals correspond to those elements previously described. The figure also displays the full depth profile of the cassette. The opened-end structure including the H-bar provides, ramped horizontal portion, and partial cylindrical rod provides the required structural stability and full depth protection for the wafer. The angled sides 40 and 42 provide for point contact of the wafers.

Figure 3A:
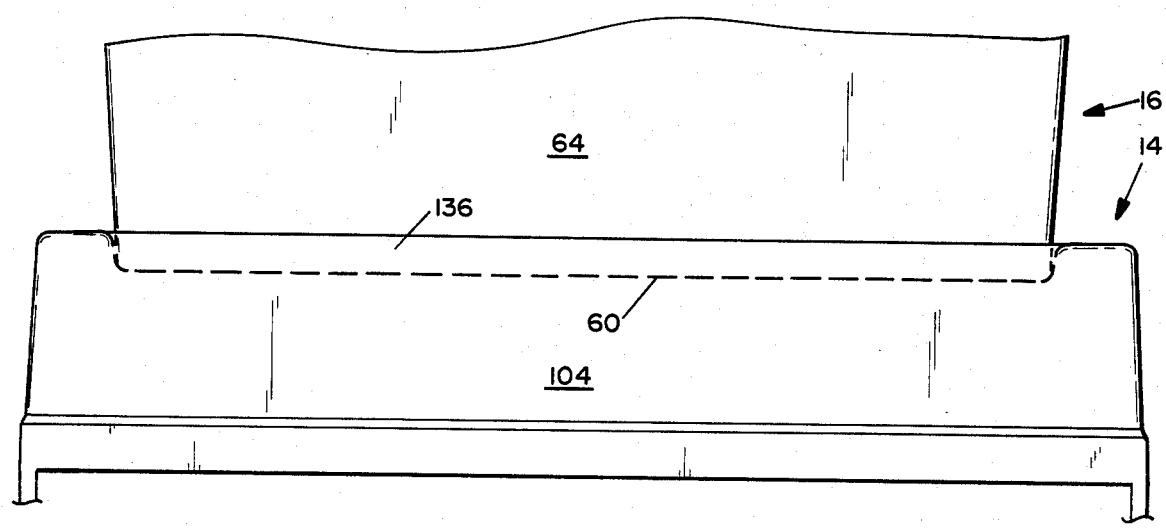
FIG. 3A illustrates interlocking between a package top and a package bottom side view.

FIG. 3A illustrates a side view of the top and bottom portions of stacked packages 10 engaging with each other as stacked where all numerals correspond to those elements previously described.

Figure 3B:
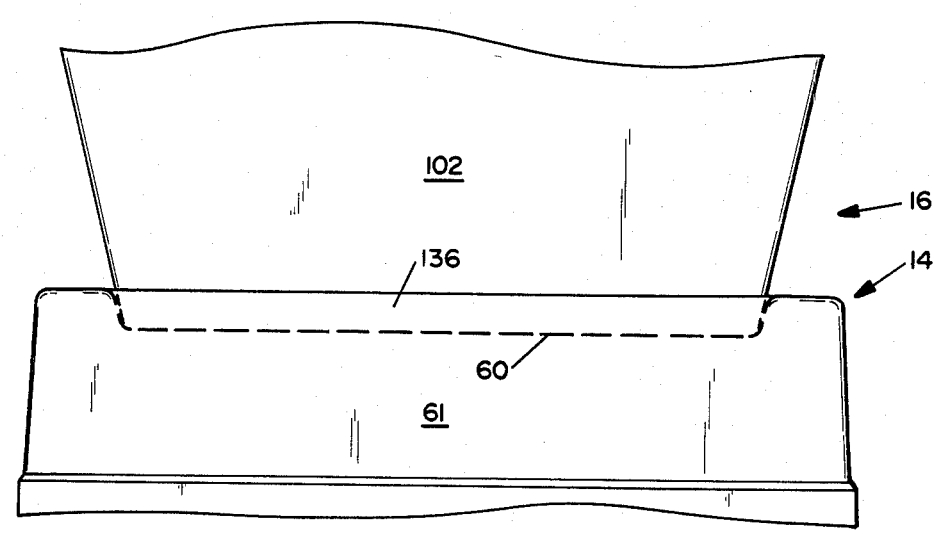
FIG. 3B illustrates interlocking between the package top and the package bottom end view.

FIG. 3B illustrates an end view corresponding to the mated and interengaged portions of the stacked package 10 top and bottom where all numerals correspond to those elements previously described. FIG. 3B is an end view of the side view of FIG. 3A. Like packages can be stacked on top and bottom of the under packages by engagement of the top recessed portion to the bottom portion of the next package bottom.

FIG. 4 illustrates a top view of the cassette 12 engaged in the package bottom 16 in looking downward when the two members 12 and 16 are interengaged with respect to each other and where all numerals correspond to those elements previously described. Representative wafers 200A–200n are illustrated as being engaged in the respective dividers of the cassette. The cassette 12 can be positioned into the package bottom 16 in either direction.

FIG. 5 illustrates a cross-sectional side view of the cassette 12, the package top 14 and the package bottom 16 illustrated with wafers 200–200n engaged with respect to each other. All numerals correspond to those elements previously described. Opposing keyways 202 can be positioned in the cassette 12 and opposing keys 204 can be positioned in the package bottom 16 as illustrated. A partial cyclindrical rod 206 as illustrated in dashed lines can also be positioned across a portion of the rod 28 providing a combination profile across the front of the H-bar end member 26. The figure also illustrates the opposing hooks 73 and 75.

MODE OF OPERATION

FIG. 5 illustrates the side view of the wafer container package 10 including the cassette 12, the package top 14, and the package bottom 16, and a plurality of engaged wafers 200a–200n with all other numerals corresponding to those elements previously described. Particularly illustrated in the drawings is the interlocking and interengaging relationship of the cassette 12 with respect to the package top 14 and the package bottom 16 with the wafers 200 engaged there between the cassette 12, the package top 14, and the package bottom 16. The wafers 200 are engaged between the dips of each of the respective dividers and the opposing longitudinal members which limits any defined movement and so that each wafer is in the center of each lip of the dividers.

The tongue engages about the groove, the hook ends latch about the holes, and the interengaging relationship between the cassette, the package bottom and the package top about the wafers occurs during engagement. This interengaging relationship particularly reflects that the package is a synergistic combination which reduces and eliminates contamination of the wafers as well as providing for storage and transportation of the the wafers, as well as providing a flush perimeter for taping of the package top and bottom 14 and 16 respectively, providing for secured shipping and storage. It is noted that the top cover 14 aligns to the cassette 12 before the finger members align the wafers in the cassette on the center line of the dividers.

Figure 6:
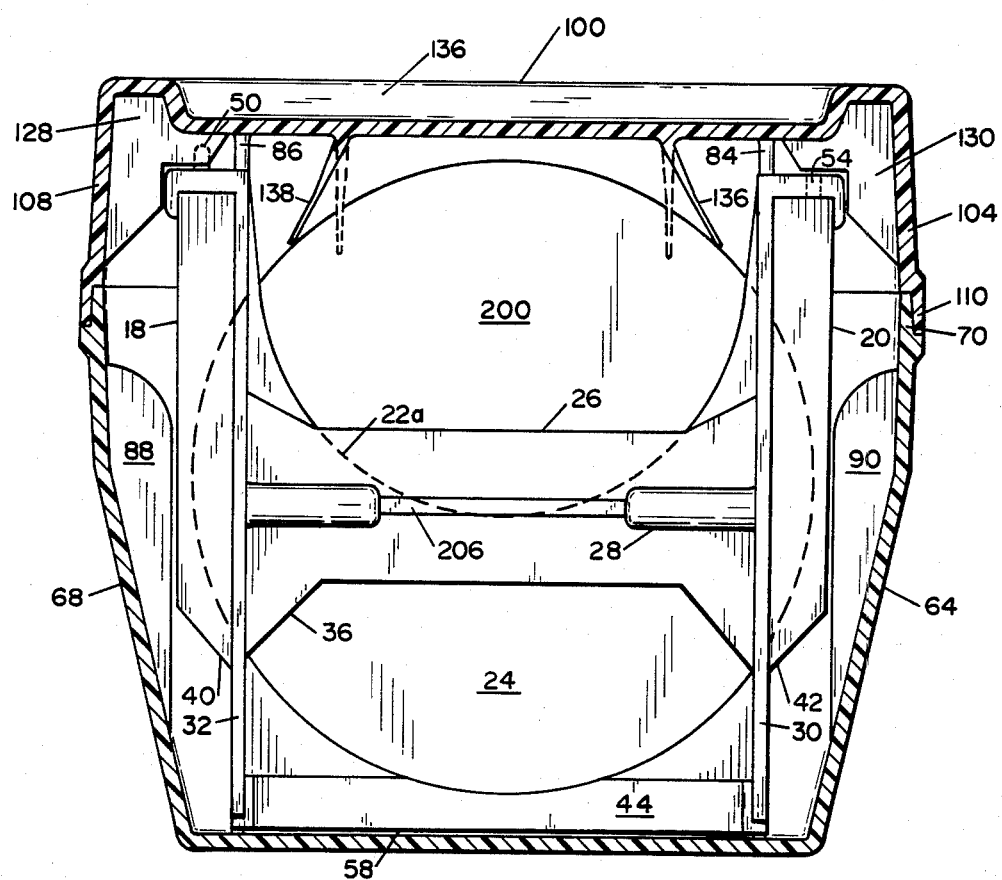
FIG. 6 illustrates an end view of FIG. 5.

FIG. 6 illustrates an end view of FIG. 5 where all numerals correspond to those elements previously described. The members are illustrated in a flexed spring members. Full depth protection of the wafers is illustrated in this figure.

Figure 7:
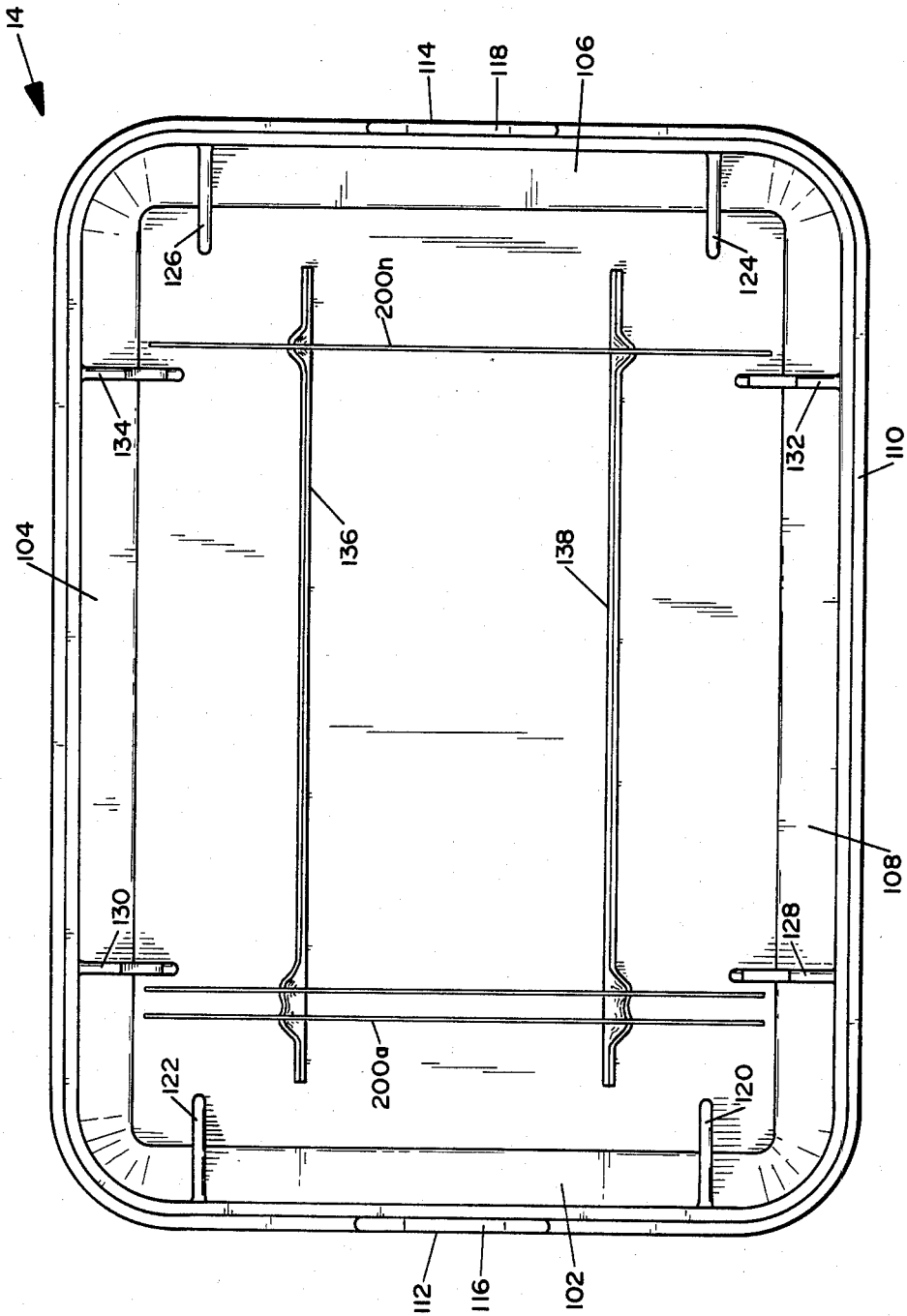
FIG. 7 illustrates a bottom view of the package top with wafers engaged against opposing fingers; and, FIG. 8 illustrates an alternative embodiment of a package top with separate and independent finger members.

FIG. 7, which illustrates a bottom view of the top package cover 14, illustrates the principle and mode of operation of the longitudinal finger members which not only secure the wafers, but also provide a spring action for popping of the top package cover 14. A first wafer 200a is illustrated in an actuated position against the top telescoping over the cassette 12 and the wafers. It is noted, by the way, that the cassette goes into the base 16 in either direction as well as the cover 14 which can secure in either direction over the cassette 12. When the package cover top 14 is positioned against the wafers, the spring members exert pressure as the package top comes down over the wafers 200 as the top 14 aligns over the cassette following where the fingers align the wafers, between the dividers.

As the package cover top 14 centers over the cassette 12 in the package bottom 16, the cover aligns to the cassette first and then the finger longitudinal members uniformly space the wafers with respect to each other, with first contact between the members and then the wafers. Next, the members engage and align the wafers in the dips of each of the dividers. The members then expand outwardly as illustrated in FIG. 7. This action between the cover and cassette and then the members and wafers provides that the wafers are aligned by a slight spring action between the members with respect to the wafers. The spring action secures the wafers within the cassette and also provides an upward pressure towards the package top with respect to the package bottom, so that when the latches are snapped open, the package top is sprung upward by the action of the finger members against the wafers.

It is particularly important to note that the latches are flush, providing that the container is suitable not only of being taped but shrink-wrapped, some suitable type of polyester, polyethylene or mylar film, further providing a non-contaminable, closed container with structural integrity. This also reduces the cost of the container and maintains structural integrity of the wafers supported therein. The cassette with respect to the package top and package bottom engages with the respective components so that the wafers are in frictional engagement of an entire package.

ALTERNATIVE EMBODIMENT OF PACKAGE TOP

Figure 8:
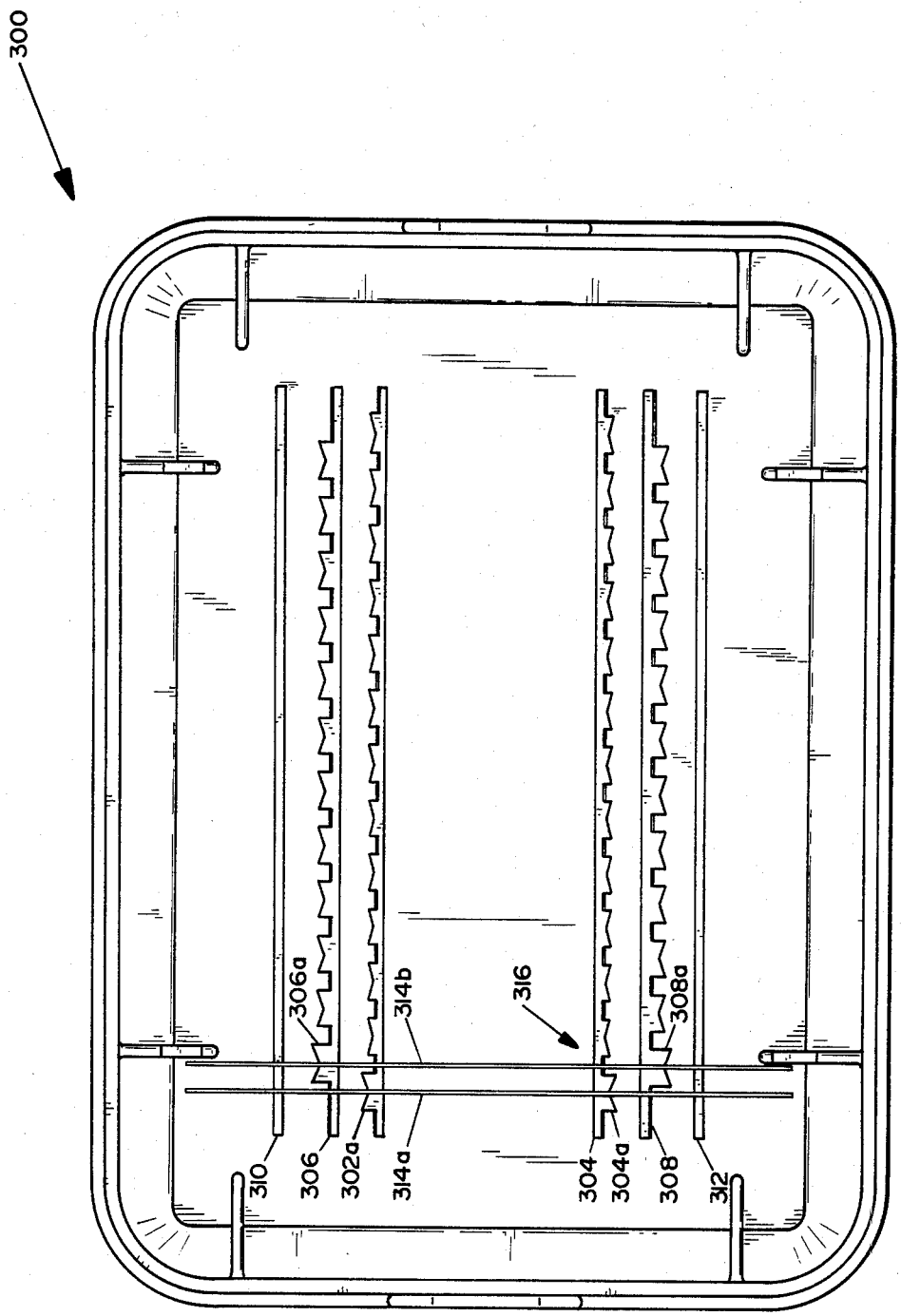

FIG. 8 illustrates a bottom view of a package top, an alternative embodiment of the present invention. The package top 300 includes two rows 302 and 304 and 306 and 308 of staggered fingers. Each finger includes a V-groove for supporting and encompassing each wafer. Longitudinal members 310 and 312 provide additional support to the package top. All other elements function as previously described.

In operation, the wafers such as 314a and 314b set on the staggered fingers 302a–n and 304a–n and 306a–n and 308a–n in the staggered relationship as illustrated at 316.

Various modifications can be made to the present invention without departing from the apparent scope thereof.

Having thus described the invention, what is claimed is:

1. Package for a plurality of silicon wafers comprising:
   a. wafer cassette including opposing configured mirror-image sides, each of said sides including opposing wafer point supports, a flat planar rear end with a rounded downward top edge secured to said sides, an open H-bar configured end including a ramped top portion and a ramped bottom portion secured to said sides, and a partial horizontal rounded cylindrical rod secured and positioned outwardly across said H-bar, left and right vertical edge supports secured to outer edges of said H-bar end, and a plurality of internal opposing dividers extending inwardly from said sides for partitioning said wafers;
   b. package bottom including a flat bottom member, four slightly angled sides, an edge groove surrounding said sides, hook catches with finger holes on ends of said opposing end sides, internal vertical end guides and end internal side guides about said sides; and,
   c. package top including a top horizontal member, four angled sides surrounding said top, a tongue lip for encompassing said grooved edge about a lower edge of each side opposing latches at ends of said top extending downwardly and a finger hole in each of said latches, opposing flexible longitudinal members for mating with each wafer, positioning vertical end and side angled members extending outwardly from interior of said sides and said ends for positioning of said cassette, and a recessed top surface in said top horizontal member whereby each of said wafers engage between a center line of each of said dividers of said cassette, between said cassette and said longitudinal finger members of said package top, said cassette engages and interengages between said vertical side and end members between said package top and package bottom, said package top tongue lip engages about and into said package edge groove, and said latches engage over said catches ends between said top and bottom packages respectively, thereby providing secure and contamination-free environment for transportation and storage of wafers in said cassette.

2. Package of claim 1 wherein said tongue lip and edge groove of said package bottom comprise a flush perimeter of a finite height surrounding a vertical perimeter of a finite height between said package top and said package bottom when said package top and package bottom are interengaged with respect to each other.

3. Package of claim 1 wherein said cassette supports twenty-five wafers.

4. Package of claim 1 wherein said catches and said latches provide for a flat flush vertical perimeter at each of said ends when engaged.

5. Package of claim 1 wherein said interengaged edge groove and said tongue lip comprise a secure environment within said package top and package bottom forming said container.

6. Package of claim 1 wherein said longitudinal member comprises opposing finger members including means providing spring for each of said finger members.

7. Package of claim 6 wherein said opposing finger members limit and secure movement of each of said wafers in said cassette.

8. Package of claim 1 wherein said opposing longitudinal finger members comprise spaced opposing separate independent fingers.

9. Package of claim 8 wherein said opposing fingers are staggered with respect to adjacent opposing fingers.

10. Package of claim 1 wherein each of said dividers have rounded teeth.

11. Package of claim 1 wherein said flexible longitudinal members of said package top include a plurality of oppositely spaced fingers along the length of said longitudinal member.

12. Package of claim 11 wherein each of said fingers includes a V groove for supporting and encompassing each of said wafers.

13. Package of claim 12 wherein each of said fingers is staggered.

14. Package of claim 12 wherein each of said fingers are aligned.

15. Package comprising:
   a. package bottom including a flat bottom member, four slightly angled sides, an edge groove surrounding said sides, hook catches with finger holes on ends of said opposing end sides, internal vertical end guides and end internal side guides about said sides; and,
   b. package top including a top horizontal member, four angled sides surrounding said top, a tongue lip for encompassing said grooved edge about a lower edge of each side opposing latches at ends of said top extending downwardly and a finger hole in each of said latches, opposing flexible longitudinal members for mating with each wafer, positioning vertical end and side angled members extending outwardly from interior of said sides and said ends for positioning of said cassette, and a recessed top surface in said top horizontal member whereby said package top tongue lip engages about and into said package edge groove, and said latches engage over said catches ends between said top and bottom packages respectively, thereby providing secure and contamination-free environment for transportation and storage.

* * * * *